US012700437B2

(12) United States Patent (10) Patent No.: US 12,700,437 B2
Fujino et al. (45) Date of Patent: Aug. 4, 2026

(54) LOW POWER INTERMEDIATE PRE-CHARGE OPERATIONS IN MEMORY

(71) Applicant: Taiwan Semiconductor Manufacturing Company Ltd., Hsinchu (TW)

(72) Inventors: Yorinobu Fujino, Hsinchu (TW); Yoshisato Yokoyama, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 124 days.

(21) Appl. No.: 18/642,302

(22) Filed: Apr. 22, 2024

(65) Prior Publication Data

US 2025/0218481 A1 Jul. 3, 2025

Related U.S. Application Data

(60) Provisional application No. 63/615,239, filed on Dec. 27, 2023.

(51) Int. Cl.
*G11C 7/10* (2006.01)
*G11C 7/12* (2006.01)

(52) U.S. Cl.
CPC .............. *G11C 7/12* (2013.01); *G11C 7/1096* (2013.01)

(58) Field of Classification Search
CPC ..................................................... G11C 7/12
See application file for complete search history.

(56) References Cited

U.S. PATENT DOCUMENTS

| | | | | |
|---|---|---|---|---|
| 5,946,251 | A * | 8/1999 | Sato ......................... | G11C 7/12 |
| | | | | 365/154 |
| 2005/0047197 | A1* | 3/2005 | Kotabe ................. | G11C 11/412 |
| | | | | 365/154 |
| 2010/0246302 | A1 | 9/2010 | Seko | |
| 2014/0098600 | A1* | 4/2014 | Kim .................... | G11C 11/1655 |
| | | | | 365/158 |
| 2015/0380077 | A1* | 12/2015 | Wu ........................ | G11C 11/419 |
| | | | | 365/154 |

FOREIGN PATENT DOCUMENTS

| | | | |
|---|---|---|---|
| KR | 10-2000-0001862 | A | 1/2000 |
| KR | 10-2018-0036528 | A | 4/2018 |
| KR | 10-2279046 | B1 | 7/2021 |
| KR | 10-2023-0020429 | A | 2/2023 |
| TW | 202401417 | A | 1/2024 |

OTHER PUBLICATIONS

Office Action issued in Taiwan Appl. No. 113134125 dated Jun. 3, 2025.
Office Action issued in Korean Appl. No. 10-2024-0197517 dated Aug. 5, 2025.

* cited by examiner

*Primary Examiner* — Hoai V Ho
(74) *Attorney, Agent, or Firm* — Foley & Lardner LLP

(57) ABSTRACT

Memory devices, circuits, and a method of operating the same are disclosed. In one aspect, a memory device includes a memory cell coupled between a first bit line and a second bit line. The memory cell includes a write circuit configured to write data to the memory cell via the first bit line and the second bit line during a write operation. The memory cell includes a voltage equalizing device configured to equalize the voltage of the first bit line and the second bit line following the write operation and prior to a second memory operation for the memory cell.

20 Claims, 10 Drawing Sheets

900

1000

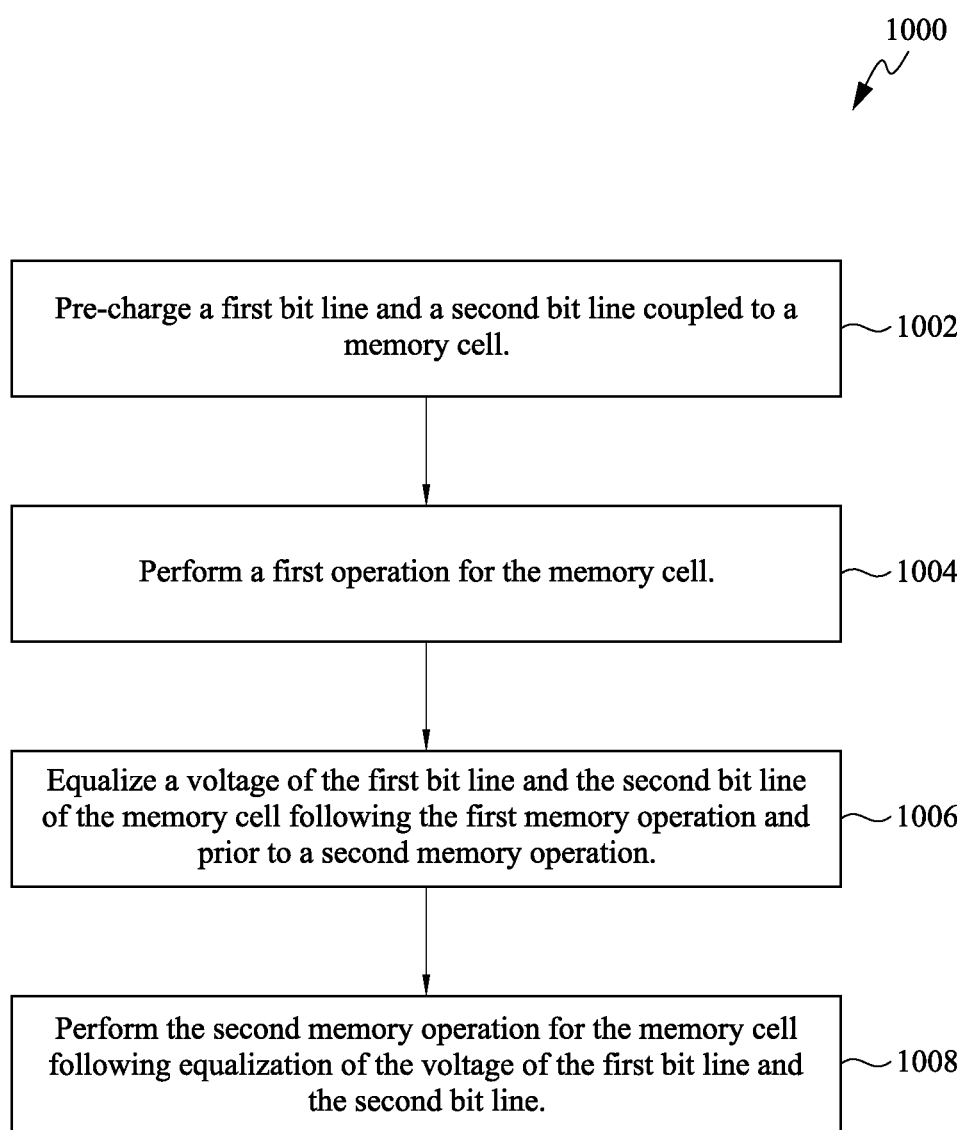

Pre-charge a first bit line and a second bit line coupled to a memory cell.          ~1002

Perform a first operation for the memory cell.          ~1004

Equalize a voltage of the first bit line and the second bit line of the memory cell following the first memory operation and prior to a second memory operation.          ~1006

Perform the second memory operation for the memory cell following equalization of the voltage of the first bit line and the second bit line.          ~1008

Fig. 10

LOW POWER INTERMEDIATE PRE-CHARGE OPERATIONS IN MEMORY

CROSS-REFERENCE TO RELATED APPLICATIONS

This application claims the benefit of and priority to U.S. Provisional Patent Application No. 63/615,239, filed Dec. 27, 2023, the contents of which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 illustrates a flowchart of example method of operating an example memory circuit that implements voltage equalization for an intermediate pre-charge during double pump memory operations, in accordance with some embodiments.

DETAILED DESCRIPTION

Figure 1:
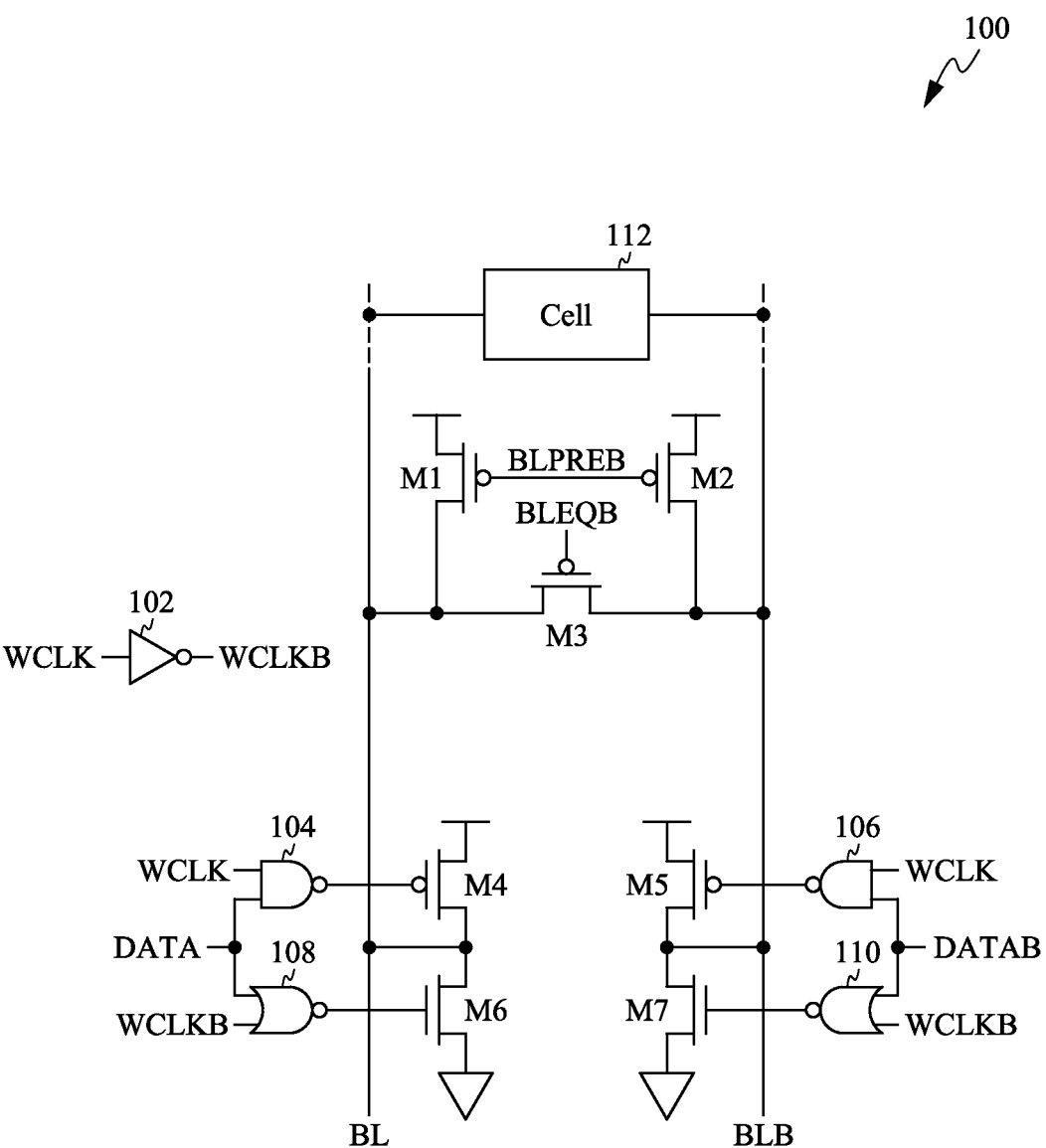
FIG. 1 illustrates a diagram of an example memory circuit having a device that equalizes bit line voltage during double pumping memory operations, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory circuits, such as dynamic random-access memory (DRAM), can implement "double pumping" operations, in which multiple memory operations are performed in a single clock cycle. For example, a read operation followed by a write operation, or a write operation followed by a read operation, can be performed in a single memory clock cycle rather than two clock cycles. In conventional memory systems, double pumping operations require bit lines of the memory circuit to be pre-charged between operations. Pre-charging includes raising the voltage level of selected bit lines to about the supply voltage level. However, such conventional approaches result in excessive power consumption. As the density and performance requirements of semiconductor technology increases, double pumping using such approaches becomes technically impracticable.

The present disclosure provides various techniques for implementing low power intermediate pre-charge operations. Such techniques do not require the voltage level of selected bit lines to be pre-charged to about the supply voltage. Instead, the techniques described herein implement circuits that skip pre-charging of bit line pairs between the first and second memory operations of double pump operation. To do so, various circuits described herein equalize the voltage between bit line pairs during intermediate pre-charge to ensure a stable marge of memory cell operation. These techniques reduce the overall power consumption of memory circuits, and thereby enable higher density memory circuits to be implemented across smaller process nodes.

FIG. 1 illustrates a diagram of an example memory circuit 100 having a device that equalizes bit line voltage during double pumping memory operations, in accordance with some embodiments. The memory circuit 100 can be included in any type of memory device or integrated circuit (IC) device. In at least one embodiment, a memory device is an individual IC device. In some embodiments, a memory device is included as a part of a larger IC device which comprises circuitry other than the memory device for other functionalities.

Each of the components shown in the memory circuit 100 may receive power from one or more voltage sources (e.g., the supply voltage shown here as VDD). The memory circuit 100 may include one or more logic gates and sub-circuits, each of which may be constructed from one or more logic gates. Logic gates are electronic devices that perform logical operations on one or more input signals to produce a single output signal.

Various embodiments of the circuits and logic gates that implement the memory circuit 100 may include various transistors. The transistors described herein may have a certain type (n-type or p-type), but embodiments are not limited thereto. The transistors can be any suitable type of transistor including, but not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

It should be understood that although the memory circuit 100 shown in FIG. 1 can be a portion of a larger memory circuit, including any number of pairs of bit lines BL and BLB, which may be addressed by corresponding memory cell selection circuitry. Likewise, although not shown here for visual clarity, various additional circuitry may be included to address (e.g., select) various portions of the memory cells or to perform different memory operations, including but not limited to compute-in-memory (CIM) operations, write operations, or read operations, among others.

The memory circuit 100 is shown as including at least one memory cell 112 positioned between a pair of bit lines BL and BLB. The memory cell 112 can be any type of memory device capable of storing at least one bit of memory data, including but not limited to a static random access memory (SRAM) cell or a dynamic random access memory (DRAM) cell, among others. The bit lines BL and BLB, and the memory cell 112 therebetween, can be included as a portion of a column of a memory array, in some implementations. In such implementations, multiple memory cells 112 may be arranged in multiple rows and coupled to each of the pair of bit lines BL and BLB. The memory array can include multiple columns, which each column including a corresponding set of bit lines having multiple memory cells 112 coupled thereto.

Individual memory cells 112 of the memory array can be addressed by accessing corresponding bit lines BL and BLB (to select by column) and/or corresponding word lines or source lines (to select by row). Addressed memory cells can be selected for write and/or read operations. The memory array can be implemented for double pumping operations, in which multiple memory operations may be performed in a single memory clock cycle. Signals that select memory cells and coordinate read/write/double pump operations can be provided by a memory control circuit. The memory control circuit may include any type of control circuit that provides signals to coordinate read or write operations via the circuitry of the memory circuit 100. The memory control circuit may provide any of the signals described herein to control the functionality of the memory circuit 100.

The memory circuit 100 is shown as receiving a write clock (WCLK) signal. The WCLK signal is a timing signal that controls the timing of write operations in the memory circuit 100. During a write operation, the WCLK signal causes data to be written to the memory cells at the correct time and in sync with other signals and processes within the memory circuit 100. As shown, the WCLK signal is provided as input to an inverter 102, which produces the WCLKB signal. As used herein, a signal having the term "B" appended thereto is a logical inverse of the same signal without the "B" suffix. In circumstances where a corresponding signal lacking the "B" suffix is not present or referenced, the "B" suffix can indicate that the corresponding signal is an active low signal (e.g., active when in a logic low, logic zero, or ground state).

The memory circuit 100 as shown, the circuit 100 includes seven transistors M1, M2, M3, M4, M5, M6, and M7, each of which implement a portion of the circuitry to perform low power double pump operations. Although each of the transistors M1-M7 of FIG. are shown as one transistor, embodiments are not limited thereto. For example, each of the transistors may include multiple transistors ("sub-transistor(s)") that are connected to one another in parallel. For example, in an embodiment, each of the sub-transistors of any transistor described herein can include respective gate, drain, and source terminals, each of which may be connected to one another in parallel.

The circuit 100 includes transistors M1, M2, M3, M4, M5, M6, and M7. In some implementations, the transistors M1, M2, M3, M4, and M5 each include a pMOSFET, and the transistors M6 and M7 each include an nMOSFET. It is appreciated that each of the transistors M1-M7 can include any of various other types of transistors (e.g., bipolar junction transistors, high-electron-mobility transistors, etc.) while remaining within the scope of the present disclosure. As shown, the sources of the transistors M1, M2, M4, and M5 are electrically coupled with the supply voltage VDD, and the sources of the transistors M6 and M7 are connected to a ground voltage. The drain terminals of the transistors M4 and M5 are respectively coupled to the drain terminals of the transistors M6 and M7. The drain terminals of the transistors M4 and M6 are coupled to the first bit line BL and the drain terminals of the transistors M5 and M7 are coupled to the second bit line BLB. The drain terminals of the transistors M1 and M2 are coupled respectively to the bit lines BL and BLB.

The transistors M1 and M2 can be activated during a pre-charge operation to set the voltage level of the bit lines BL and BLB to about the supply voltage VDD. As shown, the gate terminals of the transistors M1 and M2 are coupled to one another and receive an active-low bit line pre-charge signal BLPREB. When the BLPREB signal is logic high (e.g., logic one, about the supply voltage of VDD, etc.), each of the transistors M1 and M2 are turned off and not conducting. The voltage of the bit lines BL and BLB, in such a state, are therefore set according to other circuit elements (e.g., the transistors M4 and M6, the transistors M5 and M7, etc.).

When the BLPREB signal is logic low (e.g., logic zero, about equal to ground voltage, etc.), each of the transistors M1 and M2 are turned on and begin conducting. When the transistor M1 turns on and conducts, the voltage at the first bit line BL is set to about the supply voltage VDD. When the transistor M2 turns on and conducts, the voltage at the second bit line BLB is set to about the supply voltage VDD.

As described in connection with FIG. 2, the BLPREB signal can be held in a logic low state (e.g., by a memory control circuit) until the bit lines are sufficiently pre-charged (e.g., after a predetermined amount of time). Pre-charge operations can be performed prior to read and/or write operations, including prior to double pumping operations.

Prior to a read operation, the bit lines BL and BLB are pre-charged to a reference voltage. This prepares the bit lines for the sensing and amplification of the voltage changes induced by the memory cell during the read operation. Similarly, before a write operation, the bit lines are pre-charged to a reference voltage level. This ensures a well-defined starting point for the voltage differential that will be induced during the subsequent write operation. However, during double pumping operations, the transistor M3 can be activated as part of an intermediate pre-charge, instead of fully pre-charging, to equalize the voltage of the first bit line and the second bit line.

The transistor M3 has a first source/drain terminal coupled to the first bit line BL and a second source/drain terminal coupled to the second bit line BLB. In this example, the transistor M3 can has a gate terminal that receives a bit line voltage equalization signal (shown as active low) indicated as BLEQB. As described in connection with FIG. 2, the equalized voltage to which the first bit line BL and the second bit line BLB are set can be less than a supply voltage VDD, but greater than a ground voltage for the memory circuit. The transistor M3 is in parallel with the memory cell 112, as shown. In this example, the source/drain terminals of the transistor M3 are also respectively coupled to corresponding source/drain terminals of the transistors M1 and M2. Although the transistor M3 is shown as a p-type device, it should be understood that any suitable transistor device may be utilized, including but not limited to n-type devices.

Each of the first and second bit lines BL and BLB are shown as including write circuits. A first write circuit includes the NAND gate 104, the NOR gate 108, the transistor M4, and the transistor M6. The gate terminal of the transistor M4 is coupled to the output of the NAND gate 104 and the gate terminal of the transistor M6 is coupled to the output of the NOR gate 108. The NAND gate 104 receives an input data signal DATA as input and the write clock signal WCLK as input. The NOR gate 108 receives input data signal DATA as input and the logical inverse of the write clock signal WCLKB as input. As described herein, the logical inverse of the write clock signal WCLKB can be generated as output by the inverter 102.

The input data signal DATA can be a logic high or logic low signal that indicates a bit that is to be written to the memory cell 112. For example, in some implementations, the input data signal DATA can be a logic high signal to indicate a logical binary "1" value is to be written to the memory cell 112, and the input data signal DATA can be a logic low signal to indicate a logical binary "0" value is to be written to the memory cell 112, or vice versa. In some implementations, the memory circuit 100 can include one or more inverters to generate the logical inverse of the data signal DATAB.

When the write clock signal WCLK is in the logical low state (e.g., a ground state, a log zero state, etc.), a read operation for the memory cell 112 is indicated. During a read operation, because the WCLK signal is logic low, the output of the NAND gate 104 is always logic high regardless of the input data signal DATA. As such, the gate terminal of the p-type transistor M4 is provided with a logical high signal during read operations, causing the transistor M4 to be turned off and to not conduct. Likewise, when the WCLK signal is logic low, the logical inverse of the write signal WLKB is logic high. When the WCLKB signal is logic high (e.g., logical one, about the supply voltage VDD), the output of the NOR gate 108 is always logic low regardless of the input data signal DATA. As the output of the NOR gate 108 is provided to the gate terminal of the n-type transistor M6, the transistor M6 is turned off and does not conduct during read operations.

A second write circuit for the second, complementary bit line BLB includes the NAND gate 106, the NOR gate 110, the transistor M5, and the transistor M7. The gate terminal of the p-type transistor M5 is coupled to the output of the NAND gate 106 and the gate terminal of the n-type transistor M7 is coupled to the output of the NOR gate 110. The NAND gate 106 receives an input data signal DATA as input and the write clock signal WCLK as input. The NOR gate 110 receives input data signal DATA as input and the logical inverse of the write clock signal WCLKB as input.

As described herein, during a read operation the write clock signal WCLK is in the logical low state (e.g., a ground state, a log zero state, etc.). When the WCLK signal is logic low, the output of the NAND gate 106 is always logic high regardless of the input data signal DATA. As such, the gate terminal of the p-type transistor M5 is provided with a logical high signal during read operations, causing the transistor M5 to be turned off and to not conduct. Likewise, when the WCLK signal is logic low, the logical inverse of the write signal WLKB is logic high. When the WCLKB signal is logic high (e.g., logical one, about the supply voltage VDD), the output of the NOR gate 110 is always logic low regardless of the input data signal DATA. As the output of the NOR gate 110 is provided to the gate terminal of the n-type transistor M7, the transistor M7 is turned off and does not conduct during read operations.

As such, the first and second write circuits effectively do not change the voltage of the bit lines BL and BLB during a read operation. Instead, the memory cell 112 itself, which is coupled between the bit lines BL and BLB, causes a voltage differential between the bit lines BL and BLB depending on its state. For example, if the memory cell 112 stores a charge (e.g., representing a logical one), the memory cell 112 can cause one of the bit lines BL or BLB to be discharged, resulting in a voltage drop between the bit lines BL and BLB. Furthering this example, if the memory cell 112 is not storing a charge (e.g., representing a logical zero), the bit lines BL and BLB will maintain their pre-charge voltage levels. Differential sensing circuitry can compare the voltages of the bit lines BL and BLB to determine the logic state of the memory cell 112 during the read operation. The difference in voltage levels can be amplified and used to generate the output signal indicating the stored data (e.g., logical zero or logical one).

During a write operation, the WCLK signal can be in a logical high state and its logical inverse WCLKB can be in the logical low state. The input data signal DATA can be in the logical low state, indicating that a logical zero is to be written to the memory cell 112 or a logical high state, indicating that a logical one is to be written to the memory cell 112. During a write operation, when the DATA signal is in the logic high state, the NAND gate receives two logic high signals (from WCLK and DATA), and produces a logic low output to the gate terminal of the transistor M4. The logic low signal at the gate terminal of the p-type transistor M4 causes the transistor M4 to turn on and conduct. Furthering this example, the NOR gate 108 receives one logic high signal (DATA) and one logic low signal (WCLKB). The output of the NOR gate 108 is therefore a logic low signal, causing the n-type transistor M6 to be turned off and not conducting. When transistor M4 is turned on and conducting, the supply voltage VDD is then coupled to the bit line BL, causing the voltage of the bit line BL to be raised to about the supply voltage VDD.

Furthering the example where the input data signal DATA is in the logic high state during a write operation, the NAND gate 106 receives one logic high signal (WCLK) and one logic low signal (DATAB, the inverse of DATA). As such, the output of the NAND gate 106 provided to the gate terminal of the transistor M5 is in the logic high state, causing the transistor M5 to be turned off and not conducting. The NOR gate 110 receives two logic low signals (both DATAB and WCLKB), causing the NOR gate 110 to generate and provide a logic high output to the gate terminal of the transistor M7. The logic high at the gate terminal of the transistor M7 causes the transistor M7 to turn on and conduct, effectively coupling the second bit line BLB to ground (e.g., setting it to about zero). As such, during an operation to write a logical one to the memory cell 112, the bit line BL can be set to about the supply voltage and the complementary bit line BLB can be set to about the ground voltage.

The inverse of the foregoing example can occur when the input data signal DATA to be written to the memory cell 112 is a logical zero. For example, when DATA is in a logical low state during the write operation, the output of the NAND gate 104 is logic high, causing the transistor M4 to turn off and not conduct, while the output of the NOR gate 108 is also logic high, causing the transistor M6 to turn on and conduct, thereby pulling the voltage of the bit line BL to about the ground voltage. Similarly, when DATA is in a logical low state during the write operation, the output of the NAND gate 106 is logic low, causing the transistor M4 to turn on and conduct, while the output of the NOR gate 110 is logic low, causing the transistor M7 to turn off and conduct, thereby pulling the voltage of the complementary bit line BLB to about the supply voltage. As such, during an operation to write a logical zero to the memory cell 112, the bit line BL can be set to about the ground voltage and the complementary bit line BLB can be set to about the supply voltage. The voltage difference between BL and BLB causes the memory cell 112 to store the data in the input data signal DATA.

Figure 2:
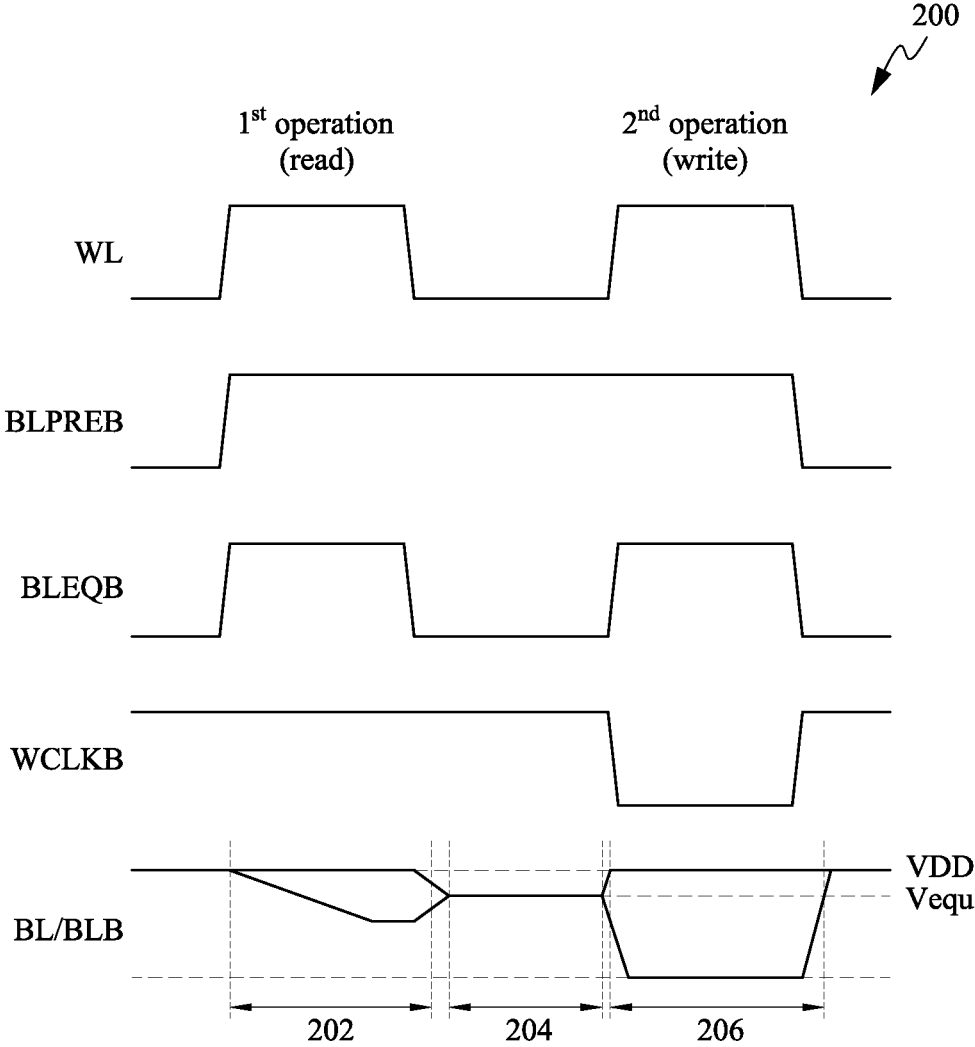
FIG. 2 illustrates a diagram showing example waveforms of signals that can propagate through the memory circuit shown in FIG. 1 during a double pump memory operation, in accordance with some embodiments.

FIG. 2 illustrates a diagram 200 showing example waveforms of signals that can propagate through the memory circuit shown in FIG. 1 during a double pump memory operation, in accordance with some embodiments. The example waveforms shown in the diagram 200 represent a double pumping operation that may occur during a single memory clock cycle, in some implementations. The double pumping operation includes a read operation during the time period 202, voltage equalization during the time period 204, and a write operation during the time period 206 following voltage equalization.

In this example, the double pumping operation initialized by pre-charging the bit lines (e.g., BL and BLB) of a memory cell prior to the operation by setting the active-low pre-charge signal BLPREB to logic low prior to the time period 202. This causes both bit lines BL and BLB to be about equal to the supply voltage VDD, as shown. During the read operation, the word line WL select signal for the corresponding memory cell (e.g., the memory cell 112) is logic high, causing the memory cell to be selected for the read operation. At the same time, the active low pre-charge signal BLPREB transitions to the logic high state, disabling the pre-charge operation. The active-low voltage equalization signal BLEQB is also driven to the logic high state, disabling voltage equalization between the bit lines BL and BLB.

As the first operation is a read operation, the logical inverse of the write clock WCLKB is maintained in the logic high state, indicating the read operation. During the time period 202, as shown, the voltage of the bit lines BL and BLB diverge slightly as the memory cell discharges, indicating that the memory cell stored a logical one. As described herein, the voltage of the bit lines during the read operation is not modified following the pre-charge operation, causing any charge stored in the memory cell to modify the voltage differential across the bit lines BL and BLB. The difference in voltage between the bit lines BL and BLB can be amplified to detect the data stored in the memory cell.

After the read operation, the word line select signal WL can return to the logic low state, while the active-low pre-charge signal BLPREB and the logical inverse of the write clock WCLKB are maintained in the logic high state. However, rather than performing a second pre-charge operation, the active low voltage equalization signal BLEQB is pulled to the logic low state. As shown, during the double-pump equalization time period 204, a voltage equalization device (e.g., the transistor M3) causes the voltage between the bit lines BL and BLB to be about equal, at the voltage level Vequ. As shown, the voltage level Vequ is less than the supply voltage VDD, and greater than the ground voltage.

Once the voltage has been equalized for the time period 204, a write operation is performed as the second operation in the double pumping operation. As shown, during the time period 206, the word line WL select signal for the corresponding memory cell (e.g., the memory cell 112) is set to logic high, causing the memory cell to be selected for the write operation. At the same time, the active low voltage equalization signal BLEQB transitions to the logic high state, disabling voltage equalization. The active-low pre-charge signal BLPREB is maintained in the logic high state. During the time period 206 for the write operation, the logical inverse of the write clock WCLKB transitions to the logic low state, indicating the write operation.

As shown, the bit lines BL and BLB diverge in voltage, with one of the bit lines transitioning to about the supply voltage VDD and the other complementary bit line transitioning to about the ground voltage for the duration 206 of the write operation. Once the write operation is complete following the time period 206, pre-charging for the next operation can be initiated, by transitioning the word line WL, the BLEQB, and the BLPREB to the logic low state, while transitioning the inverse of the write clock WCLKB to the logic high state. This causes both bit lines of the memory cell to be set to about the supply voltage for the next set of operations, as shown. Similar waveforms are provided for a double pumping operation with starting with a write operation in FIG. 9.

Figure 9:
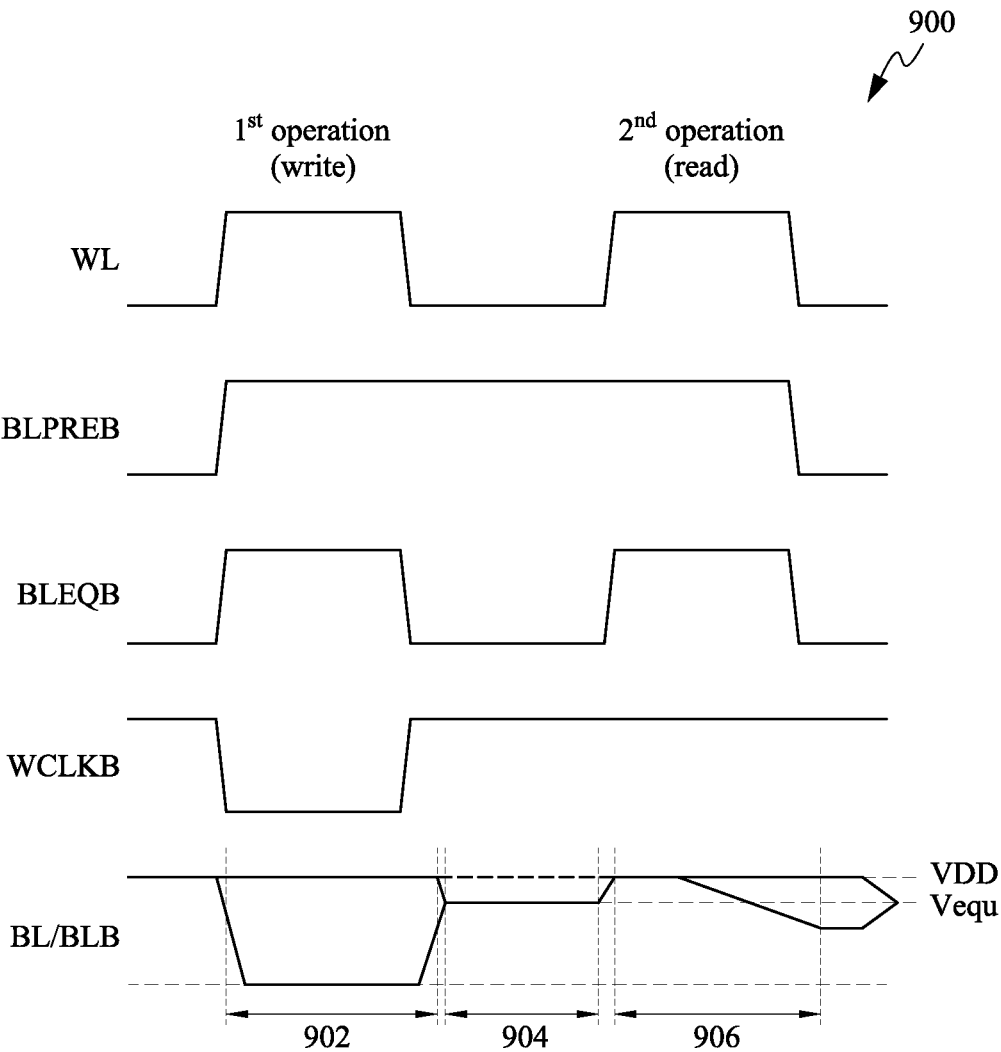
FIG. 9 illustrates a diagram showing example waveforms of signals during another double pump memory operation, in accordance with some embodiments.

Referring to FIG. 9, illustrated is a diagram 900 showing example waveforms of signals during another double pump memory operation, in accordance with some embodiments. The example waveforms shown in the diagram 900 represent a double pumping operation that may occur during a single memory clock cycle, in some implementations. The double pumping operation includes a write operation during the time period 902, voltage equalization during the time period 904, and a read operation during the time period 906 following voltage equalization.

In this example, the double pumping operation initialized by pre-charging the bit lines (e.g., BL and BLB) of a memory cell prior to the operation by setting the active-low pre-charge signal BLPREB to logic low prior to the time period 902. This causes both bit lines BL and BLB to be about equal to the supply voltage VDD, as shown. During the first write operation, the word line WL select signal for the corresponding memory cell (e.g., the memory cell 112) is set to logic high, causing the memory cell to be selected for the write operation. At the same time, the active low pre-charge signal BLPREB transitions to the logic high state, disabling the pre-charge operation. The active-low voltage equalization signal BLEQB is also driven to the logic high state, disabling voltage equalization between the bit lines BL and BLB.

As the first operation is a write operation, the logical inverse of the write clock WCLKB is set to the logic low state, indicating the write operation. During the time period 902, as shown, the voltage of the bit lines diverge to VDD and ground (e.g., based upon the state of the input data signal), causing input data to be written to the memory cell. As described herein, one of the bit lines BL and BLB is set to logic high and the other is set to logic low, causing the circuit components (e.g., a capacitor) of the memory cell to charge or discharge to store data.

After the write operation, the word line select signal WL can return to the logic low state, while the active-low pre-charge signal BLPREB is maintained in the logic high state and the logical inverse of the write clock WCLKB is driven to the logic high state. However, rather than performing a second pre-charge operation, the active low voltage equalization signal BLEQB is pulled to the logic low state. As shown, during the double-pump equalization time period 904, this causes the voltage equalization device (e.g., the transistor M3) to set the voltage between the bit lines BL and BLB to be about equal, at the voltage level Vequ. As shown, the voltage level Vequ is less than the supply voltage VDD, and greater than the ground voltage.

Once the voltage has been equalized for the time period 904, a read operation is performed as the second operation in the double pumping operation. As shown, during the time period 906, the word line WL select signal for the corresponding memory cell (e.g., the memory cell 112) is set to logic high, causing the memory cell to be selected for the read operation. At the same time, the active low voltage equalization signal BLEQB transitions to the logic high state, disabling voltage equalization. The active-low pre-charge signal BLPREB is maintained in the logic high state. During the time period 906 for the read operation, the logical inverse of the write clock WCLKB is maintained in the logic high state, indicating the write operation.

As shown, the bit lines BL and BLB diverge slightly as the memory cell discharges, indicating that the memory cell stored a logical one. As described herein, the voltage of the bit lines during the read operation is not modified following the pre-charge operation, causing any charge stored in the memory cell to modify the voltage differential across the bit lines BL and BLB. The difference in voltage between the bit lines BL and BLB can be amplified to detect the data stored in the memory cell. Once the read operation is complete following the time period 906, pre-charging for the next operation can be initiated, by transitioning the word line WL, the BLEQB, and the BLPREB to the logic low state, while maintaining the inverse of the write clock WCLKB in the logic high state. This causes both bit lines of the memory cell to be set to about the supply voltage for the next set of operations, as shown. Various configurations for memory circuits that can implement the waveforms shown in FIGS. 2 and 9 are described in connection with FIGS. 3-8.

Figure 3:
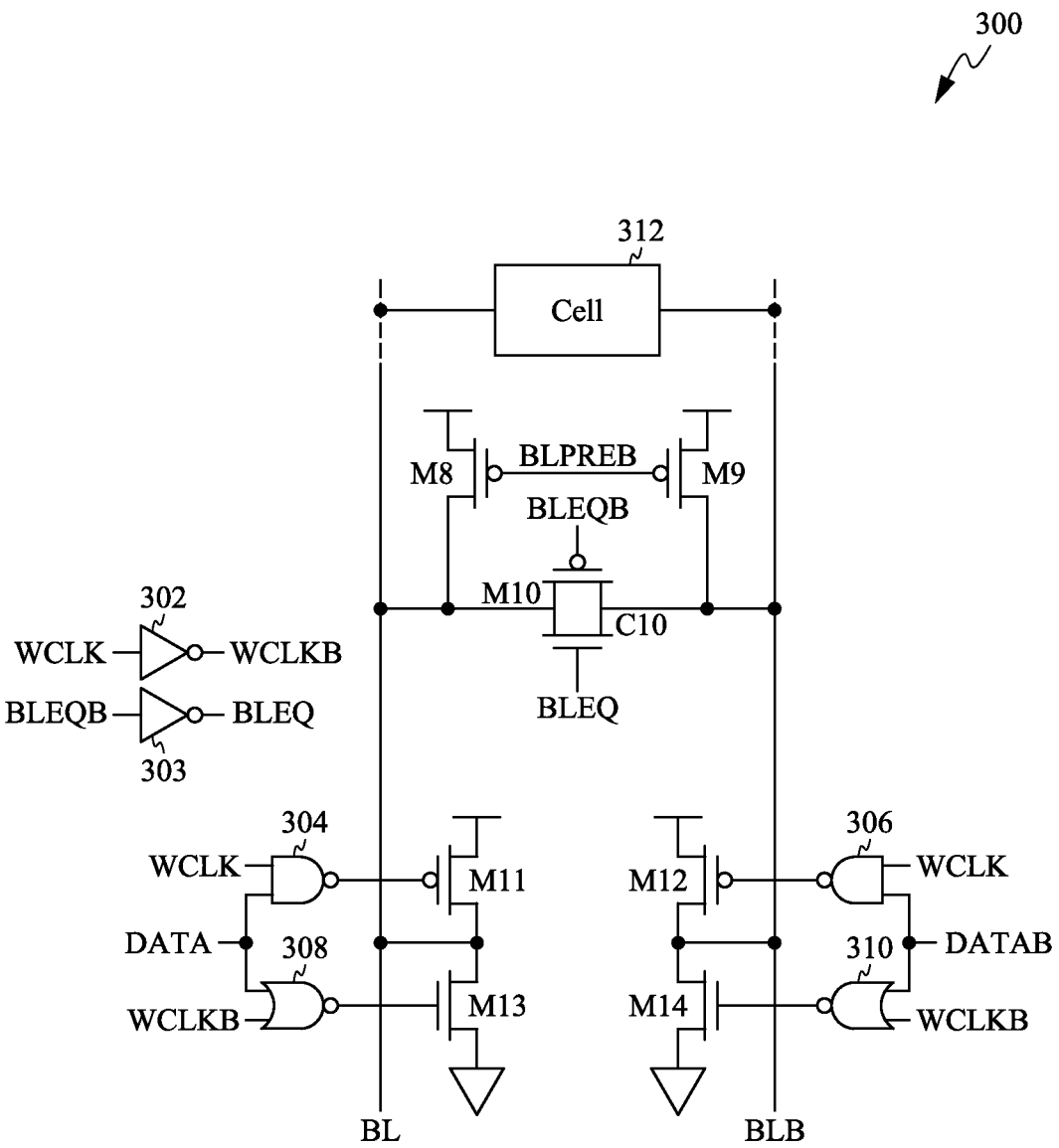
FIG. 3 illustrates a diagram of an example memory circuit having two complementary devices that equalize bit line voltage during double pumping memory operations, in accordance with some embodiments.

FIG. 3 illustrates a diagram of an example memory circuit 300 having two complementary devices that equalize bit line voltage during double pumping memory operations, in accordance with some embodiments. The memory circuit 300 may be similar to the memory circuit 100 shown in FIG. 1, while including an additional complementary transistor C10. As shown, the memory circuit 300 includes the transistors M8, M9, M10, C10, M11, M12, M13, and M14. The memory circuit 300 includes NAND gates 304 and 306 and NOR gates 308 and 310. In some implementations, the transistors M8, M9, M10, M11, and M12 each include a pMOSFET, and the transistors C10, M13, and M14 each include an nMOSFET. It is appreciated that each of the transistors C10 and M7-M14 can include any of various other types of transistors (e.g., bipolar junction transistors, high-electron-mobility transistors, etc.) while remaining within the scope of the present disclosure.

Various embodiments of the circuits and logic gates that implement the memory circuit 300 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like.

It should be understood that although the memory circuit 300 shown in FIG. 3 can be a portion of a larger memory circuit, including any number of pairs of bit lines BL and BLB, which may be addressed by corresponding memory cell selection circuitry. Likewise, although not shown here for visual clarity, various additional circuitry may be included to address (e.g., select) various portions of the memory cells or to perform different memory operations, including but not limited to CIM operations, write operations, or read operations, among others.

As shown, each of the transistor M8, M9, M10, M11, M12, M13, and M14 can be similar to, and can include any of the structure and functionality as, the transistors M1, M2, M3, M4, M5, M6, and M7 described in connection with FIG. 1. Likewise, the various logical components, such as the memory cell 312, the inverter 302, the NAND gate 304, the NAND gate 306, the NOR gate 308, and the NOR gate 310, can be similar to and incorporate any of the structure and functionality of their corresponding counterparts the memory cell 112, the inverter 102, the NAND gate 104, the NAND gate 106, the NOR gate 108, and the NOR gate 110 of FIG. 1.

For example, the inverter 302, the NAND gates 304 and 306, the NOR gates 308 and 310, and the transistors M11, M12, M13, and M14 can receive the data input signal DATA and the write clock WCLK and WLKB signals to write data to the memory cell 312 via the bit lines BL and BLB, as described in connection with FIG. 1. Likewise, each of the transistors M8 and M9 can receive the bit line pre-charge signal BLPREB to pre-charge each of the bit lines during prior to a double pump memory operation (e.g., a read followed by a write or a write followed by a read during a single clock cycle).

In addition, the transistor M10 can be similar to the transistor M3 of FIG. 1 and can receive the active-low bit line voltage equalization signal BLEQB at its gate terminal. Additionally, the memory circuit 300 can include a second inverter 303, which can generate the active-high counterpart of BLEQB, shown here as BLEQ. As shown, the memory circuit 300 includes an additional, complementary transistor C10 in parallel with the transistor M10. The complementary transistor C10 is shown as being an n-type transistor, with a first source/drain terminal coupled to the first bit line BL and a second source/drain terminal coupled to the second bit line BLB. The gate terminal of the complementary transistor C10 receives the active high voltage equalization signal BLEQ. The use of complementary transistors M10 and C10 provide increased drive strength compared to a single transistor, permitting additional current to flow through the circuit and reducing voltage stress compared to single-transistor approaches.

Figure 4:
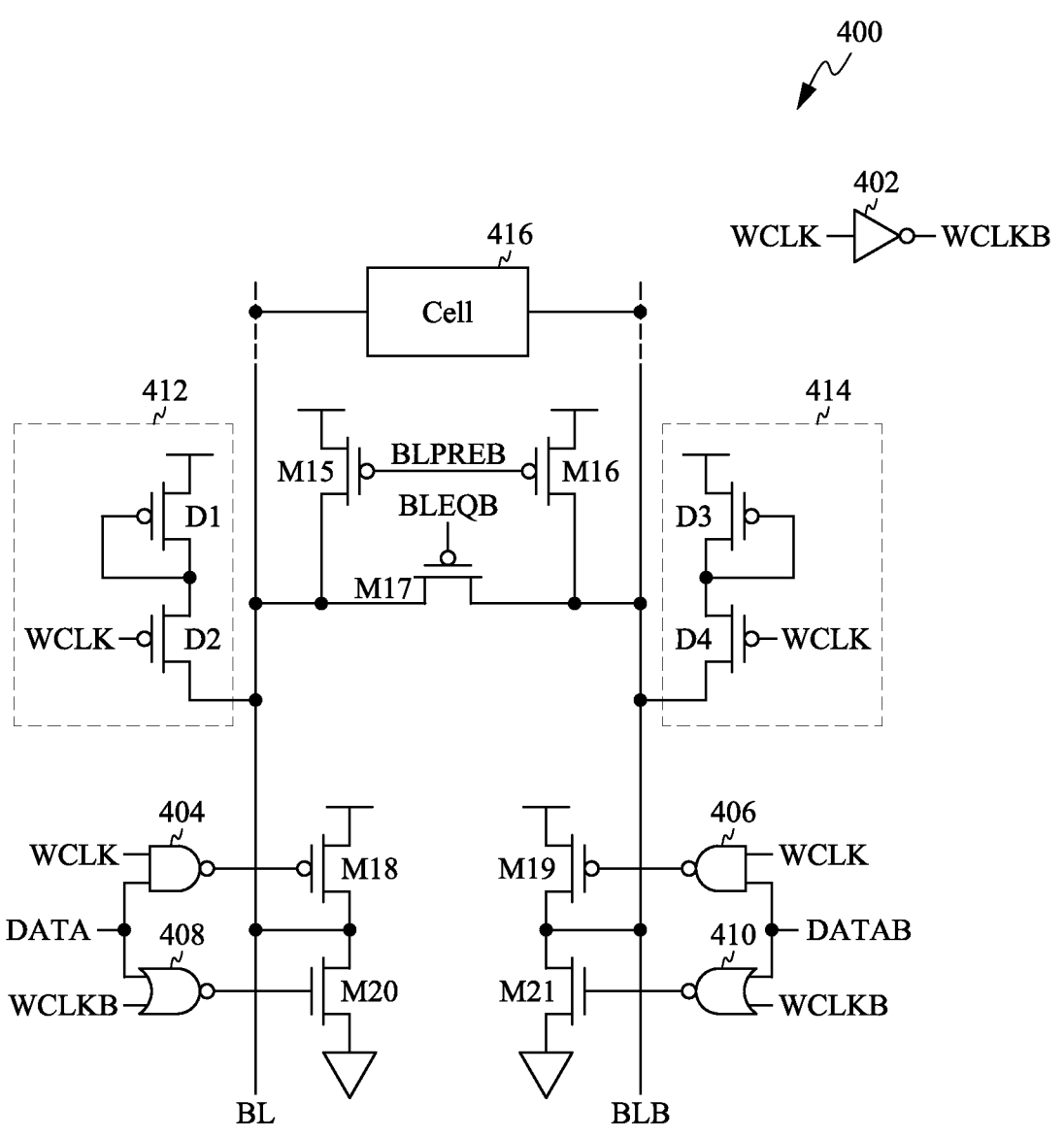
FIG. 4 illustrates a diagram of an example memory circuit having a device that equalizes bit line voltage during double pumping memory operations and voltage clamping devices coupled to each bit line, in accordance with some embodiments.

FIG. 4 illustrates a diagram of an example memory circuit 400 having a device that equalizes bit line voltage during double pumping memory operations and voltage clamping devices coupled to each bit line, in accordance with some embodiments. The memory circuit 400 may be similar to the memory circuit 100 shown in FIG. 1, while including voltage clamping circuits 412 and 414. As shown, the memory circuit 400 includes the transistors M15, M16, M17, M18, M19, M20, and M21. The first voltage clamping circuit 412, which operates as a diode clamping device coupled to the bit line BL, includes the transistors D1 and D2. The second voltage clamping circuit 414, which operates as a diode clamping device coupled to the bit line BLB, includes the transistors D3 and D4.

The memory circuit 400 includes NAND gates 404 and 406 and NOR gates 408 and 410. In some implementations, the transistors M15, M16, M17, M18, M19, D1, D2, D3, and D4 each include a pMOSFET, and the transistors M20, and M21 each include an nMOSFET. It is appreciated that each of the transistors M15-M21 and D1-D4 can include any of various other types of transistors (e.g., bipolar junction transistors, high-electron-mobility transistors, etc.) while remaining within the scope of the present disclosure. Various embodiments of the circuits and logic gates that implement the memory circuit 400 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like.

It should be understood that although the memory circuit 400 shown in FIG. 4 can be a portion of a larger memory circuit, including any number of pairs of bit lines BL and BLB, which may be addressed by corresponding memory cell selection circuitry. Likewise, although not shown here for visual clarity, various additional circuitry may be included to address (e.g., select) various portions of the memory cells or to perform different memory operations, including but not limited to CIM operations, write operations, or read operations, among others.

As shown, each of the transistor M15, M16, M17, M18, M19, M20, and M21 can be similar to, and can include any of the structure and functionality as, the transistors M1, M2, M3, M4, M5, M6, and M7 described in connection with FIG. 1. Likewise, the various logical components, such as the memory cell 416, the inverter 402, the NAND gate 404, the NAND gate 406, the NOR gate 408, and the NOR gate 410, can be similar to and incorporate any of the structure and functionality of their corresponding counterparts the memory cell 112, the inverter 102, the NAND gate 104, the NAND gate 106, the NOR gate 108, and the NOR gate 110 of FIG. 1.

For example, the inverter 402, the NAND gates 404 and 406, the NOR gates 408 and 410, and the transistors M18, M19, M20, and M21 can receive the data input signal DATA and the write clock WCLK and WLKB signals to write data to the memory cell 416 via the bit lines BL and BLB, as described in connection with FIG. 1. Likewise, each of the transistors M15 and M16 can receive the bit line pre-charge signal BLPREB to pre-charge each of the bit lines during prior to a double pump memory operation (e.g., a read followed by a write or a write followed by a read during a single clock cycle). The transistor M17 can be similar to the transistor M3 of FIG. 1 and can receive the active-low bit line voltage equalization signal BLEQB at its gate terminal.

As shown, the memory circuit 400 includes the first voltage clamping circuit 412 and the second voltage clamping circuit 414, which can be activated during non-write operations, when the WCLK signal is in the logic low state. As shown, the first voltage clamping circuit 412 includes the transistor D1 and the transistor D2. A first source/drain terminal of the transistor D1 is coupled to the supply voltage VDD, and a second source/drain terminal of the transistor D1 is coupled to a first source/drain terminal of the transistor D2. The second source/drain terminal of the transistor D2 is coupled to the bit line BL. The gate terminal of the transistor D1 is coupled to the source/drain terminals of the transistors D1 and D2, as shown, in a diode configuration.

The transistor D1, in this configuration, forms a PMOS diode-connected transistor, and behaves as a diode-like circuit element. The gate terminal of the transistor D2 is connected to the write clock signal WCLK. As such, when the memory circuit is performing a write operation, the WCLK signal is in the logic high state, and the transistor D2 is turned off and not conducting. This prevents the first voltage clamping circuit 412 from being activated or affecting the voltage of the bit line BL.

The memory circuit 400 includes second voltage clamping circuit 414, which is shown as including the transistor D3 and the transistor D4. A first source/drain terminal of the transistor D3 is coupled to the supply voltage VDD, and a second source/drain terminal of the transistor D3 is coupled to a first source/drain terminal of the transistor D4. The second source/drain terminal of the transistor D4 is coupled to the bit line BLB. The gate terminal of the transistor D3 is coupled to the source/drain terminals of the transistors D3 and D4, as shown, in a diode configuration.

The transistor D3, in this configuration, forms a PMOS diode-connected transistor, and behaves as a diode-like circuit element. The gate terminal of the transistor D4 is connected to the write clock signal WCLK. As such, when the memory circuit is performing a write operation, the WCLK signal is in the logic high state, and the transistor D4 is turned off and not conducting. This prevents the second voltage clamping circuit 414 from being activated or affecting the voltage of the bit line BLB.

During non-write operations when the WCLK signal is in the logic low state, the transistor D2 and the transistor D4 are turned on and conduct. This effectively clamps the minimum voltage of the bit lines BL and BLB to the value of the supply voltage minus the threshold voltage of the transistors D1 and D3 plus the voltage drop across each of the transistors D2 and D4, respectively. Clamping the voltage drop during read operations can improve the overall read performance of the device and facilitate a suitable equalization voltage Vequ between the bit lines BL and BLB for double pump memory operations.

Figure 5:
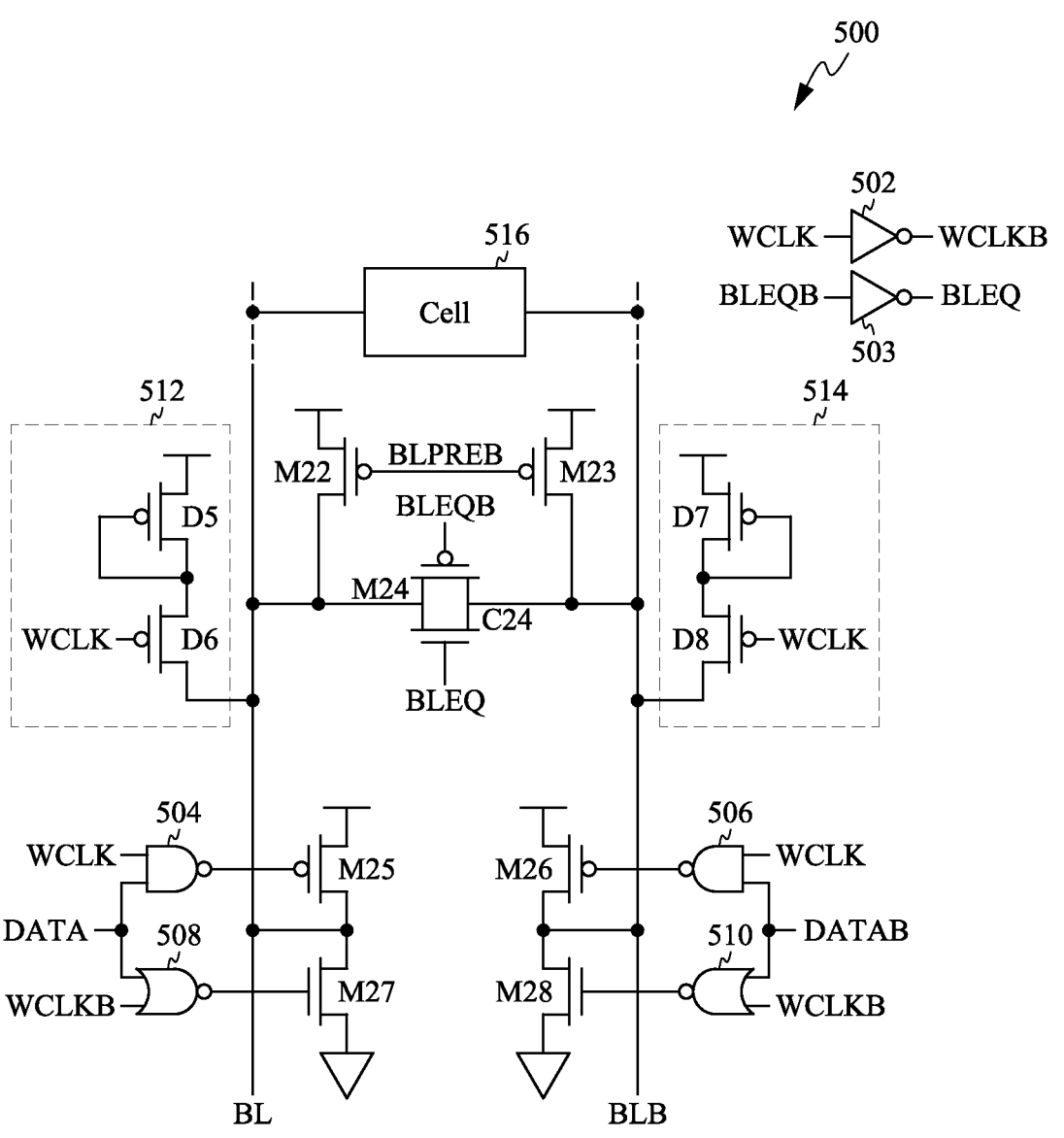
FIG. 5 illustrates a diagram of an example memory circuit similar to the memory circuit shown in FIG. 4, having complementary devices that equalize bit line voltage during memory operations, in accordance with some embodiments.

FIG. 5 illustrates a diagram of an example memory circuit 500 similar to the memory circuit 400 shown in FIG. 4, having complementary devices that equalize bit line voltage during memory operations, in accordance with some embodiments. The memory circuit 500 may be similar to the memory circuit 100 shown in FIG. 1, while including voltage clamping circuits 512 and 514 similar to the voltage clamping circuits 412 and 414, respectively, described in connection with FIG. 4. As shown, the memory circuit 500 includes the transistors M22, M23, M24, C24, M25, M26, M27, and M28. The first voltage clamping circuit 512, which operates as a diode clamping device coupled to the bit line BL, includes the transistors D5 and D6. The second voltage clamping circuit 514, which operates as a diode clamping device coupled to the bit line BLB, includes the transistors D7 and D8.

The memory circuit 500 includes NAND gates 504 and 506 and NOR gates 508 and 510. In some implementations, the transistors M22, M23, M24, M25, M26, D5, D6, D7, and D8 each include a pMOSFET, and the transistors C24, M27, and M28 each include an nMOSFET. It is appreciated that each of the transistors C24 and M22-M28 can include any of various other types of transistors (e.g., bipolar junction transistors, high-electron-mobility transistors, etc.) while remaining within the scope of the present disclosure. Various embodiments of the circuits and logic gates that implement the memory circuit 500 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like.

It should be understood that although the memory circuit 500 shown in FIG. 5 can be a portion of a larger memory circuit, including any number of pairs of bit lines BL and BLB, which may be addressed by corresponding memory cell selection circuitry. Likewise, although not shown here for visual clarity, various additional circuitry may be included to address (e.g., select) various portions of the memory cells or to perform different memory operations, including but not limited to CIM operations, write operations, or read operations, among others.

As shown, each of the transistor M22, M23, M24, C24, M25, M26, M27, and M28 can be similar to, and can include any of the structure and functionality as, the transistors M8, M9, M10, C10, M11, M12, M13, and M14 described in connection with FIG. 3. Likewise, the various logical components, such as the memory cell 516, the inverter 502, the second inverter 503, the NAND gate 504, the NAND gate 506, the NOR gate 508, and the NOR gate 510, can be similar to and incorporate any of the structure and functionality of their corresponding counterparts the memory cell 312, the inverter 302, the second inverter 303, the NAND gate 304, the NAND gate 306, the NOR gate 308, and the NOR gate 310 of FIG. 3.

For example, the inverter 502, the NAND gates 504 and 506, the NOR gates 508 and 510, and the transistors M25, M26, M27, and M28 can receive the data input signal DATA and the write clock WCLK and WLKB signals to write data to the memory cell 516 via the bit lines BL and BLB, as described in connection with FIGS. 1 and 3. Likewise, each of the transistors M22 and M23 can receive the bit line pre-charge signal BLPREB to pre-charge each of the bit lines during prior to a double pump memory operation (e.g., a read followed by a write or a write followed by a read during a single clock cycle). The transistor M24 can be similar to the transistor M3 of FIG. 1 and can receive the active-low bit line voltage equalization signal BLEQB at its gate terminal.

Each of the voltage clamping circuits 512 and 514, and the transistors D5, D6, D7, and D8 included therein can be similar to, and include any of the structure and functionality of, the voltage clamping circuits 412 and 414, and the transistors D1, D2, D3, and D4 of FIG. 4. As described herein, the voltage clamping circuits 512 and 514 can clamps the minimum voltage of the bit lines BL and BLB, respectively, to the value of the supply voltage minus the threshold voltage of the transistors D5 and D6, and the voltage drop across the transistors D7 and D8 for each of the bit lines BL and BLB, respectively. Clamping the voltage drop during read operations can improve the overall read performance of the device, and facilitate a suitable equalization voltage Vequ between the bit lines BL and BLB for double pump memory operations.

As shown, the memory circuit 500 includes an additional, complementary transistor C24 in parallel with the transistor M24. The complementary transistor C24 is shown as being an n-type transistor, with a first source/drain terminal coupled to the first bit line BL and a second source/drain terminal coupled to the second bit line BLB. The gate terminal of the complementary transistor C24 receives the active high voltage equalization signal BLEQ. The use of complementary transistors M24 and C24 provide increased drive strength compared to a single transistor, permitting additional current to flow through the circuit and reducing voltage stress compared to single-transistor approaches.

Figure 6:
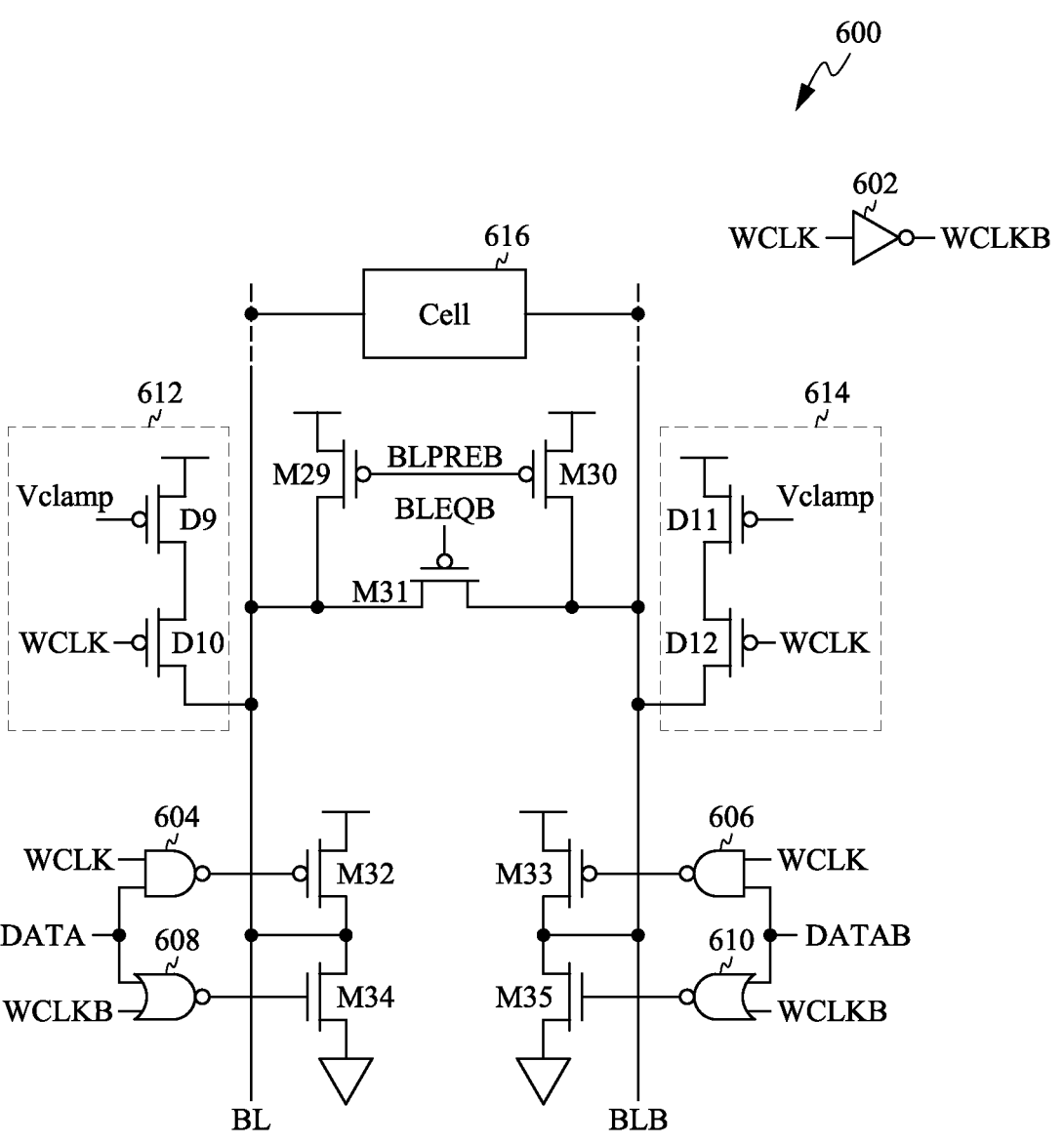
FIG. 6 illustrates a diagram of an example memory circuit similar to the memory circuit shown in FIG. 4, voltage clamping devices coupled to each bit line that receive a clamping voltage, in accordance with some embodiments.

FIG. 6 illustrates a diagram of an example memory circuit 600 similar to the memory circuit 400 shown in FIG. 4, voltage clamping devices coupled to each bit line that receive a clamping voltage, in accordance with some embodiments. The memory circuit 600 may be similar to the memory circuit 100 shown in FIG. 1, while including voltage clamping circuits 612 and 614. As shown, the memory circuit 600 includes the transistors M29, M30, M31, M32, M33, M34, and M35. The first voltage clamping circuit 612, which operates as a configurable clamping device coupled to the bit line BL, includes the transistors D9 and D10. The second voltage clamping circuit 614, which operates as a configurable clamping device coupled to the bit line BLB, includes the transistors D11 and D12.

The memory circuit 600 includes NAND gates 604 and 606 and NOR gates 608 and 610. In some implementations, the transistors M29, M30, M31, M32, M33, D10, and D12 each include a pMOSFET, and the transistors D9, D11, M34, and M35 each include an nMOSFET. It is appreciated that each of the transistors M29-M35 and D9-D12 can include any of various other types of transistors (e.g., bipolar junction transistors, high-electron-mobility transistors, etc.) while remaining within the scope of the present disclosure. Various embodiments of the circuits and logic gates that implement the memory circuit 600 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like.

It should be understood that although the memory circuit 600 shown in FIG. 6 can be a portion of a larger memory circuit, including any number of pairs of bit lines BL and BLB, which may be addressed by corresponding memory cell selection circuitry. Likewise, although not shown here for visual clarity, various additional circuitry may be included to address (e.g., select) various portions of the memory cells or to perform different memory operations, including but not limited to CIM operations, write operations, or read operations, among others.

As shown, the memory circuit 600 includes the first voltage clamping circuit 612 and the second voltage clamping circuit 614, which can be activated during non-write operations, when the WCLK signal is in the logic low state. As shown, the first voltage clamping circuit 612 includes the transistor D9 and the transistor D10. A first source/drain terminal of the transistor D9 is coupled to the supply voltage VDD, and a second source/drain terminal of the transistor D9 is coupled to a first source/drain terminal of the transistor D10. The second source/drain terminal of the transistor D10 is coupled to the bit line BL. The gate terminal of the transistor D9 receives a voltage clamp control signal Vclamp, as shown.

The transistor D9, in this configuration, forms a configurable resistor or current source, any may operate in the ohmic or linear region by varying the voltage Vclamp. The gate terminal of the transistor D10 is connected to the write clock signal WCLK. As such, when the memory circuit is performing a write operation, the WCLK signal is in the logic high state, and the transistor D10 is turned off and not conducting. This prevents the first voltage clamping circuit 612 from being activated or affecting the voltage of the bit line BL. During write operations, the voltage Vclamp can be set to turn the transistors D9 and D11 off.

The memory circuit 600 includes second voltage clamping circuit 614, which is shown as including the transistor D11 and the transistor D12. A first source/drain terminal of the transistor D11 is coupled to the supply voltage VDD, and a second source/drain terminal of the transistor D11 is coupled to a first source/drain terminal of the transistor D12. The second source/drain terminal of the transistor D12 is coupled to the bit line BLB. Similar to the gate terminal of the transistor D9, the gate terminal of the transistor D11 receives the voltage clamp control signal Vclamp, as shown.

The transistor D11, in this configuration, forms a configurable resistor or current source, any may operate in the ohmic or linear region by varying the voltage Vclamp. The gate terminal of the transistor D12 is connected to the write clock signal WCLK. As such, when the memory circuit is performing a write operation, the WCLK signal is in the logic high state, and the transistor D12 is turned off and not conducting. This prevents the second voltage clamping circuit 614 from being activated or affecting the voltage of the bit line BLB.

During non-write operations when the WCLK signal is in the logic low state, the transistor D10 and the transistor D12 are turned on and conduct according to their respective electrical characteristics, the voltage at the bit lines BL and BLB, and the configuration voltage signal Vclamp. The first voltage clamping circuit 612 and the second voltage clamping circuit 614 effectively clamp the minimum voltage of the bit lines BL and BLB, respectively, to the voltage drop across the transistors D9 and D10 and the voltage drop across the transistors D11 and D12, respectively. Clamping the voltage drop during read operations can improve the overall read performance of the device and facilitate a suitable equalization voltage Vequ between the bit lines BL and BLB for double pump memory operations. The configurable voltage signal Vclamp may be provided by one or more control circuits, and varied to achieve a desired minimum voltage at each of the bit lines BL and BLB.

Figure 7:
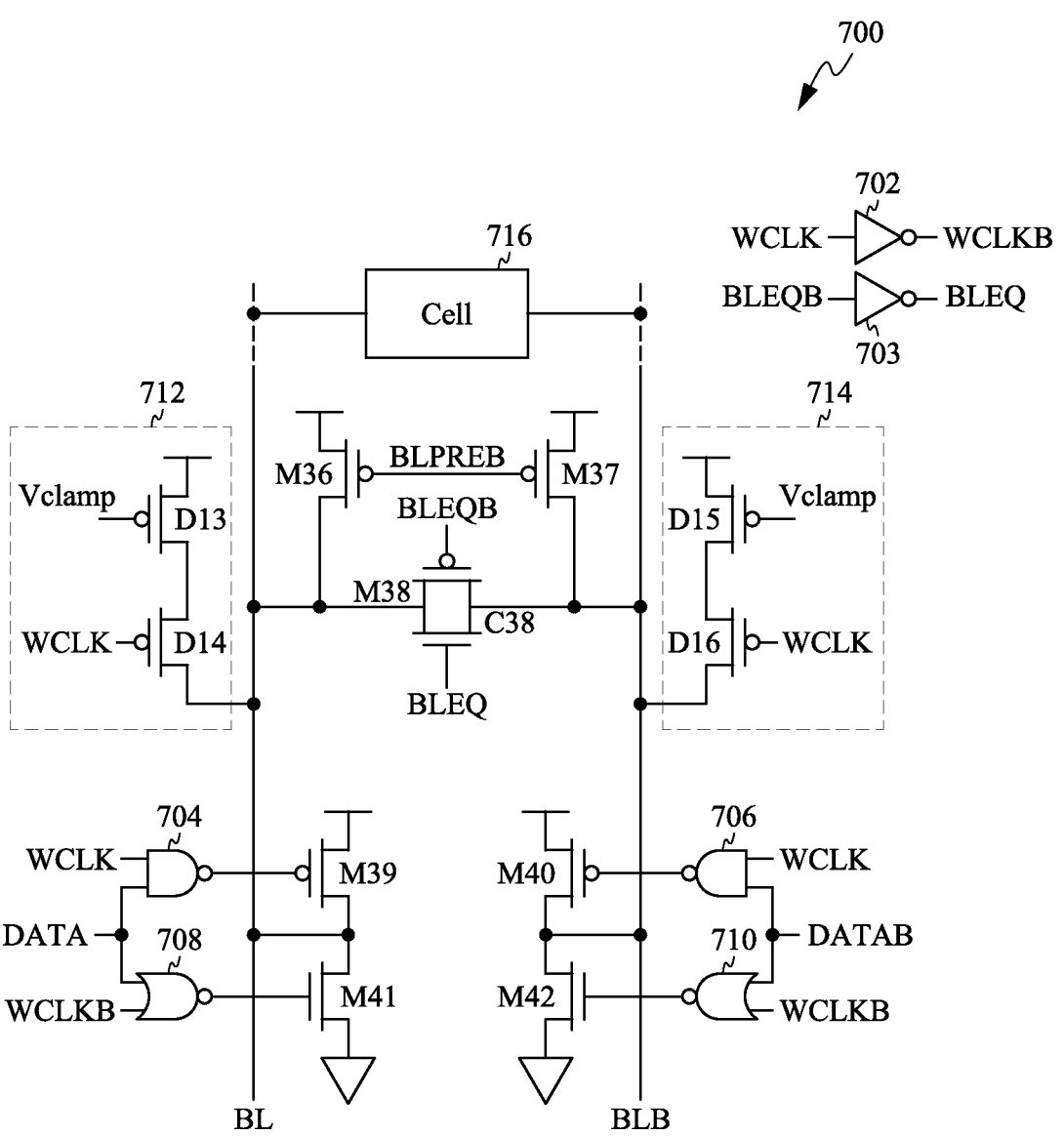
FIG. 7 illustrates a diagram of an example memory circuit similar to the memory circuit shown in FIG. 6, having complementary devices that equalize bit line voltage during memory operations, in accordance with some embodiments.

FIG. 7 illustrates a diagram of an example memory circuit 700 similar to the memory circuit shown in FIG. 6, having complementary devices that equalize bit line voltage during memory operations, in accordance with some embodiments. The memory circuit 700 may be similar to the memory circuit 100 shown in FIG. 1, while including voltage clamping circuits 712 and 714 similar to the voltage clamping circuits 612 and 614, respectively, described in connection with FIG. 6. As shown, the memory circuit 700 includes the transistors M36, M37, M38, C38, M39, M40, M41, and M42. The first voltage clamping circuit 712, which operates as a configurable voltage clamping device coupled to the bit line BL, includes the transistors D13 and D14. The second voltage clamping circuit 714, which operates as a configurable voltage clamping device coupled to the bit line BLB, includes the transistors D15 and D16.

The memory circuit 700 includes NAND gates 704 and 706 and NOR gates 708 and 710. In some implementations, the transistors M36, M37, M38, C38, M39, M40, D14, and D16 each include a pMOSFET, and the transistors C24, M41, M42, D13, and M15 each include an nMOSFET. It is appreciated that each of the transistors C38, M36-M42, and D13-D16 can include any of various other types of transistors (e.g., bipolar junction transistors, high-electron-mobility transistors, etc.) while remaining within the scope of the present disclosure. Various embodiments of the circuits and logic gates that implement the memory circuit 700 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like.

It should be understood that although the memory circuit 700 shown in FIG. 7 can be a portion of a larger memory circuit, including any number of pairs of bit lines BL and BLB, which may be addressed by corresponding memory cell selection circuitry. Likewise, although not shown here for visual clarity, various additional circuitry may be included to address (e.g., select) various portions of the memory cells or to perform different memory operations, including but not limited to CIM operations, write operations, or read operations, among others.

As shown, each of the transistor M36, M37, M38, C38, M39, M40, M41, and M42 can be similar to, and can include any of the structure and functionality as, the transistors M8, M9, M10, C10, M11, M12, M13, and M14 described in connection with FIG. 3. Likewise, the various logical components, such as the memory cell 716, the inverter 702, the second inverter 703, the NAND gate 704, the NAND gate 706, the NOR gate 708, and the NOR gate 710, can be similar to and incorporate any of the structure and functionality of their corresponding counterparts the memory cell 312, the inverter 302, the second inverter 303, the NAND gate 304, the NAND gate 306, the NOR gate 308, and the NOR gate 310 of FIG. 3.

For example, the inverter 702, the NAND gates 704 and 706, the NOR gates 708 and 710, and the transistors M39, M40, M41, and M42 can receive the data input signal DATA and the write clock WCLK and WLKB signals to write data to the memory cell 716 via the bit lines BL and BLB, as described in connection with FIGS. 1 and 3. Likewise, each of the transistors M36 and M37 can receive the bit line pre-charge signal BLPREB to pre-charge each of the bit lines during prior to a double pump memory operation (e.g., a read followed by a write or a write followed by a read during a single clock cycle). The transistor M38 can be similar to the transistor M3 of FIG. 1 and can receive the active-low bit line voltage equalization signal BLEQB at its gate terminal.

Each of the voltage clamping circuits 712 and 714, and the transistors D13, D14, D15, and D16 included therein can be similar to, and include any of the structure and functionality of, the voltage clamping circuits 612 and 614, and the transistors D9, D10, D11, and D12 of FIG. 6. As described herein, the voltage clamping circuits 712 and 714 can clamps the minimum voltage of the bit lines BL and BLB, respectively, to a configurable value according to the configuration voltage Vclamp applied to the gate terminals of each of the transistors D13 and D15. During write operations, the voltage Vclamp can be set to turn the transistors D13 and D15 off. Clamping the voltage drop during read operations can improve the overall read performance of the device and facilitate a suitable equalization voltage Vequ between the bit lines BL and BLB for double pump memory operations.

As shown, the memory circuit 700 includes an additional, complementary transistor C38 in parallel with the transistor M38. The complementary transistor C38 is shown as being an n-type transistor, with a first source/drain terminal coupled to the first bit line BL and a second source/drain terminal coupled to the second bit line BLB. The gate terminal of the complementary transistor C38 receives the active high voltage equalization signal BLEQ. The use of complementary transistors M38 and C38 provide increased drive strength compared to a single transistor, permitting additional current to flow through the circuit and reducing voltage stress compared to single-transistor approaches.

Figure 8:
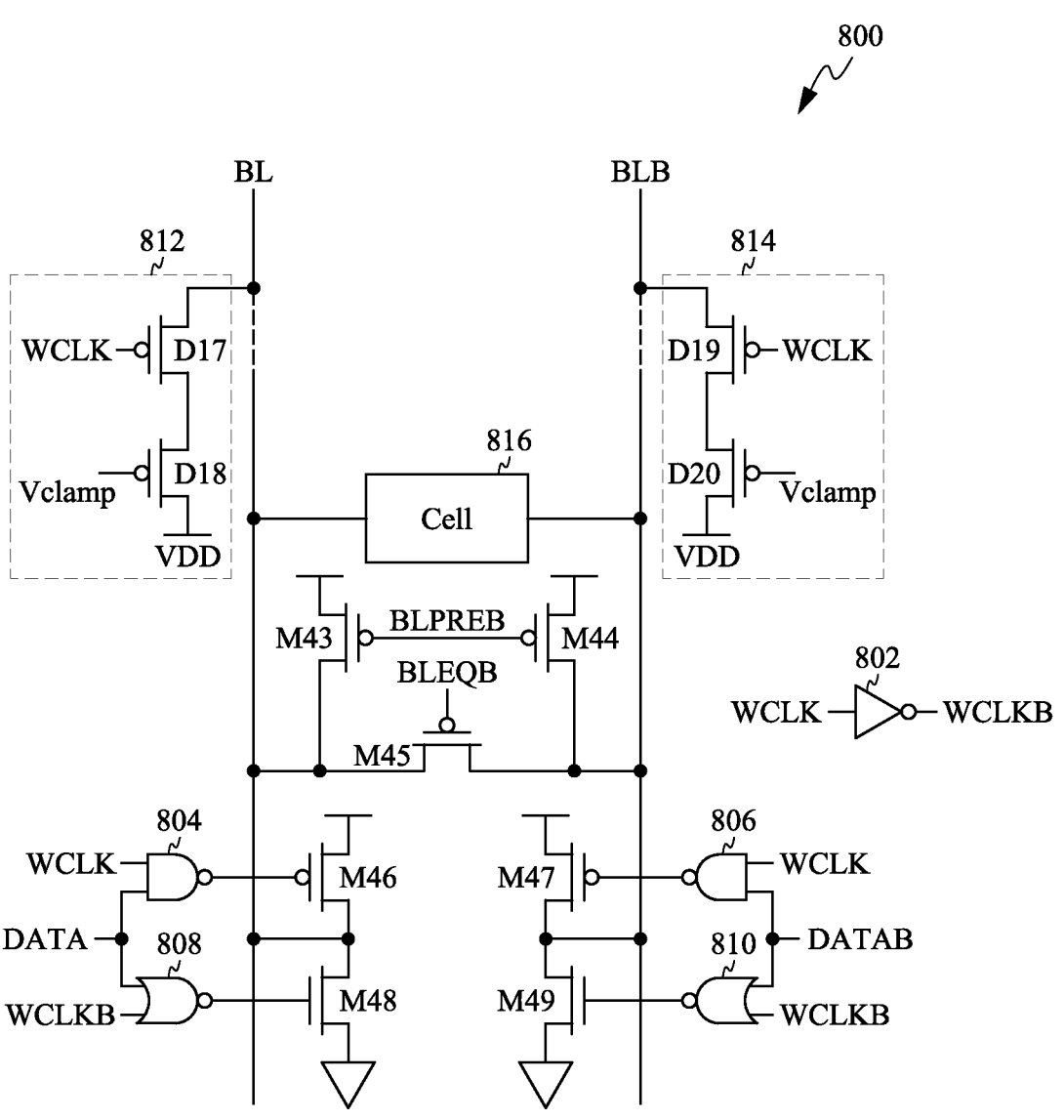
FIG. 8 illustrates a diagram of an example memory circuit including an alternative arrangement of voltage clamping devices, in accordance with some embodiments.

FIG. 8 illustrates a diagram of an example memory circuit 800 including an alternative arrangement of voltage clamping devices, in accordance with some embodiments. The memory circuit 800 may be similar to the memory circuit 100 shown in FIG. 1, while including voltage clamping circuits 812 and 814 similar to the voltage clamping circuits 612 and 614, respectively, described in connection with FIG. 6. As shown, the memory circuit 800 includes the transistors M43, M44, M45, M46, M47, M48, and M49. The first voltage clamping circuit 812, which operates as a configurable voltage clamping device coupled to the bit line BL, includes the transistors D17 and D18. The second voltage clamping device 814, which operates as a configurable voltage clamping device coupled to the bit line BLB, includes the transistors D19 and D20.

The memory circuit 800 includes NAND gates 804 and 806 and NOR gates 808 and 810. In some implementations, the transistors M43, M44, M45, M46, M47, D17, and D19 each include a pMOSFET, and the transistors M48, M49, D18, and M20 each include an nMOSFET. It is appreciated that each of the transistors M43-M49, and D17-D20 can include any of various other types of transistors (e.g., bipolar junction transistors, high-electron-mobility transistors, etc.) while remaining within the scope of the present disclosure. Various embodiments of the circuits and logic gates that implement the memory circuit 800 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like.

It should be understood that although the memory circuit 800 shown in FIG. 8 can be a portion of a larger memory circuit, including any number of pairs of bit lines BL and BLB, which may be addressed by corresponding memory cell selection circuitry. Likewise, although not shown here for visual clarity, various additional circuitry may be included to address (e.g., select) various portions of the memory cells or to perform different memory operations, including but not limited to CIM operations, write operations, or read operations, among others.

As shown, each of the transistor M43, M44, M45, M46, M47, M48, and M49 can be similar to, and can include any of the structure and functionality as, the transistors M1, M2, M3, M4, M5, M6, and M7 described in connection with FIG. 1. Likewise, the various logical components, such as the memory cell 816, the inverter 802, the NAND gate 804, the NAND gate 806, the NOR gate 808, and the NOR gate 810, can be similar to and incorporate any of the structure and functionality of their corresponding counterparts the memory cell 112, the inverter 102, the NAND gate 104, the NAND gate 106, the NOR gate 108, and the NOR gate 110 of FIG. 1.

For example, the inverter 802, the NAND gates 804 and 806, the NOR gates 808 and 810, and the transistors M46, M47, M48, and M49 can receive the data input signal DATA and the write clock WCLK and WLKB signals to write data to the memory cell 816 via the bit lines BL and BLB, as described in connection with FIG. 1. Likewise, each of the transistors M43 and M44 can receive the bit line pre-charge signal BLPREB to pre-charge each of the bit lines during prior to a double pump memory operation (e.g., a read followed by a write or a write followed by a read during a single clock cycle). The transistor M45 can be similar to the transistor M3 of FIG. 1 and can receive the active-low bit line voltage equalization signal BLEQB at its gate terminal.

Each of the voltage clamping circuits 812 and 814, and the transistors D13, D14, D15, and D16 included therein can be similar to, and include any of the structure and functionality of, the voltage clamping circuits 612 and 614, and the transistors D17, D18, D19, and D20 of FIG. 6. As described herein, the voltage clamping circuits 812 and 814 can clamp the minimum voltage of the bit lines BL and BLB, respectively, to a configurable value according to the configuration voltage Vclamp applied to the gate terminals of each of the transistors D17 and D19. During write operations, the voltage Vclamp can be set to turn the transistors D17 and D19 off.

In the implementation shown in FIG. 8, the voltage clamping circuits 812 and 814 are positioned at the "far side" of the BL circuitry, e.g., above one or more memory cells 816 coupled between the bit lines BL and BLB. For example, the voltage clamping circuits 812 and 814 can be coupled at the opposite end of the bit lines BL and BLB relative to the write circuits and pre-charge illustrated as below the memory cells 816 in the memory circuit 800. In some implementations, the memory circuit 800 can include a complementary n-type device in parallel with the transistor M45, as described herein in connection with FIGS. 5 and 7.

FIG. 10 illustrates a flowchart of an example method 1000 to operate an example memory circuit that implements voltage equalization for an intermediate pre-charge during double pump memory operations, in accordance with some embodiments. The method 1000 may be used to operate a memory circuit (e.g., the memory circuit 100, 300, 400, 500, 600, 700, 800, etc.). For example, at least some of the operations described in the method 700 use layouts and schematics described in FIGS. 1 and 3-8. It is noted that the method 1000 is merely an example and is not intended to limit the present disclosure. Accordingly, it is understood that additional operations may be provided before, during, and after the method 1000 of FIG. 10, and that some other operations may only be briefly described herein.

In brief overview, the method 1000 starts with operation 1002 of pre-charging a first bit line and a second bit line coupled to a memory cell. The method 1000 proceeds to operation 1004 of performing a first operation for the memory cell. The method 1000 proceeds to operation 1006 of equalizing a voltage of the first bit line and the second bit line of the memory cell following the first memory operation and prior to a second memory operation. The method 1000 proceeds to operation 1008 of performing the second memory operation for the memory cell following equalization of the voltage of the first bit line and the second bit line.

Referring to operation 1002, a first bit line (e.g., BL) and a second bit line (e.g., BLB) coupled to a memory cell (e.g., the memory cell 112) are pre-charged. For example, a memory controller can activate one or more pre-charge devices (e.g., turn on the transistors M1 and M2) using a control signal (e.g., BLPREB) to set the voltage of the bit lines to about supply voltage (e.g., VDD). The pre-charge operation can precede a double pump memory operation, which includes multiple memory operations in a single memory clock cycle (e.g., a read followed by a write, a write followed by a read, etc.). The pre-charge operation can be performed prior to the first operation.

Referring to operation 1004, a first memory operation (e.g., a read, a write) is performed on the memory cell. The first memory operation may be a write operation or a read operation. In a read operation, voltage of the pre-charged bit lines is not changed or modified, and instead the change in voltage caused by the memory cell affecting the voltage difference between the bit lines is sensed as the logic value stored in the memory cell. In a write operation, the voltage across the bit lines is set such that an input data (e.g., a logic high or logic low bit value) is written to the memory cell. Additional circuitry (e.g., a control circuit) may provide signals to selectively activate the memory cell for the memory operation.

Referring to operation 1006, the voltage across the bit lines is equalized in an intermediate pre-charge operation following the first memory operation and prior to a second memory operation. As described herein, double pumping memory operations include multiple memory operations in a single clock cycle. To reduce overall dynamic power consumption, rather than pre-charging the bit lines of the memory cell again prior to the memory operation, the voltage of the bit lines can be set equal to each other using a voltage equalizing device (e.g., the transistor M3, complementary transistors M10 and C10, etc.). A control signal (e.g., BLEQB) can be provided to activate the voltage equalization device. The voltage (e.g., Vequ) to which the bit lines are set can be less than the supply voltage but greater than a ground voltage.

Referring to operation 1008, the second operation can be performed for the memory cell following voltage equalization of the voltage between the first bit line and the second bit line. The second memory operation can be a read operation or a write operation, and can be executed by providing corresponding control signals (e.g., WCLK) to the memory cell. In some implementations, the second memory operation can be different from the first memory operation. The second memory operation can be performed in the same clock cycle as the first memory operation, following the intermediate pre-charge operation.

In one aspect of the present disclosure, a memory device is disclosed. The memory device includes a memory cell coupled between a first bit line and a second bit line. The memory device includes a write circuit configured to write data to the memory cell via the first bit line and the second bit line during a write operation. The memory device includes a voltage equalizing device configured to equalize the voltage of the first bit line and the second bit line following the write operation and prior to a second memory operation for the memory cell.

In another aspect of the present disclosure, a circuit is disclosed. The circuit includes a first bit line and a second bit line coupled to a memory cell. The circuit includes a first transistor in parallel with the memory cell. A first source/drain terminal of the first transistor is coupled to the first bit line. A second source/drain terminal of the first transistor is coupled to the second bit line. A gate terminal of the first transistor receives a voltage equalization signal.

In yet another aspect of the present disclosure, a method is disclosed. The method includes pre-charging a first bit line and a second bit line coupled to a memory cell. The method includes performing a first memory operation for the memory cell. The method includes equalizing a voltage of the first bit line and the second bit line of the memory cell following the first memory operation and prior to a second memory operation. The method includes performing the second memory operation for the memory cell following equalization of the voltage of the first bit line and the second bit line.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory cell coupled between a first bit line and a second bit line;
   a write circuit configured to write data to the memory cell via the first bit line and the second bit line during a write operation;
   a first transistor coupled to the first bit line and gated by a write clock signal;
   a second transistor coupled between the first transistor and a supply voltage, the second transistor having a diode-connected configuration; and
   a voltage equalizing device configured to equalize a voltage of the first bit line and the second bit line following the write operation and prior to a read operation for the memory cell.

2. The memory device of claim 1, wherein the voltage equalizing device is further configured to set the voltage of the first bit line and the second bit line to a voltage less than the supply voltage.

3. The memory device of claim 1, wherein the voltage equalizing device equalizes the voltage of the first bit line and the second bit line during a double pump operation.

4. The memory device of claim 1, wherein the write circuit comprises at least one NOR gate and at least one NAND gate.

5. The memory device of claim 1, wherein the voltage equalizing device comprises at least one p-type device.

6. The memory device of claim 5, wherein the voltage equalizing device further comprises at least one n-type device coupled to the at least one p-type device in parallel.

7. The memory device of claim 1, further comprising at least one pre-charge device coupled to the first bit line and the second bit line.

8. The memory device of claim 7, wherein the at least one pre-charge device is coupled to the voltage equalizing device.

9. The memory device of claim 1, further comprising at least one voltage clamping device coupled to the second bit line.

10. The memory device of claim 9, wherein the at least one voltage clamping device is further configured to clamp the voltage of the first bit line or the second bit line according to a control signal.

11. A memory circuit, comprising:
a first bit line and a second bit line coupled to a memory cell;
a first transistor in parallel with the memory cell, a first source/drain terminal of the first transistor coupled to the first bit line, a second source/drain terminal of the first transistor coupled to the second bit line, and a gate terminal of the first transistor receiving a voltage equalization signal configured to equalize a voltage of the first bit line and the second bit line between memory operations; and
a second transistor and a third transistor, wherein a first source/drain terminal of the second transistor is coupled to a supply voltage, a second source/drain terminal of the second transistor coupled to a first source/drain terminal of the third transistor, and a second source/drain terminal of the third transistor coupled to the first bit line, and wherein the third transistor is gated by a write clock signal.

12. The memory circuit of claim 11, further comprising a fourth transistor and a fifth transistor, the fourth transistor coupled to the supply voltage and the first bit line, the fifth transistor coupled to the supply voltage and the second bit line, each of the fourth transistor and the fifth transistor receiving a pre-charge signal.

13. The memory circuit of claim 11, further comprising a second transistor in parallel with the first transistor.

14. The memory circuit of claim 11, wherein the first transistor is a p-type transistor.

15. The memory circuit of claim 11, wherein a gate terminal of the second transistor is coupled to the second source/drain terminal of the second transistor.

16. The memory circuit of claim 11, wherein a gate terminal of the second transistor receives a voltage clamp control signal.

17. A method, comprising:
pre-charging a first bit line and a second bit line coupled to a memory cell;
performing a first memory operation for the memory cell, wherein a voltage of at least the first bit line is clamped during the first memory operation, the voltage being clamped using (i) a first transistor coupled to the first bit line and gated by a write clock signal, and (ii) a second transistor coupled between the first transistor and a supply voltage, the second transistor having a diode-connected configuration;
equalizing a voltage of the first bit line and the second bit line of the memory cell following the first memory operation and prior to a second memory operation; and
performing the second memory operation for the memory cell following equalization of the voltage of the first bit line and the second bit line.

18. The method of claim 17, wherein the voltage of the first bit line and the second bit line is equalized to a voltage less than a supply voltage.

19. The method of claim 17, wherein the first memory operation is a read operation and the second memory operation is a write operation.

20. The method of claim 19, wherein the write clock signal is in a logic high state during the read operation and in a logic low state during the write operation.

* * * * *